US005381067A

United States Patent [19]

Greenstein et al.

[11] Patent Number: 5,381,067

[45] Date of Patent: Jan. 10, 1995

[54] ELECTRICAL IMPEDANCE NORMALIZATION FOR AN ULTRASONIC TRANSDUCER ARRAY

[75] Inventors: Michael Greenstein, Los Altos; Hewlett E. Melton, Jr., Sunnyvale, both of Calif.

[73] Assignee: Hewlett-Packard Company, Palo Alto, Calif.

[21] Appl. No.: 29,212

[22] Filed: Mar. 10, 1993

[51] Int. Cl.[6] .............................................. H01L 41/08

[52] U.S. Cl. .................................... 310/334; 310/359; 310/326; 128/660.01

[58] Field of Search ................................ 310/334–337, 310/357–359, 326; 128/660.01, 660.06, 661.01

[56] References Cited

U.S. PATENT DOCUMENTS

| | | | |
|---|---|---|---|
| 2,411,551 | 11/1946 | Mason | 310/334 |
| 2,928,068 | 3/1960 | Samsel et al. | 310/358 |
| 3,922,572 | 11/1975 | Cook et al. | 310/334 |
| 3,939,467 | 2/1976 | Cook et al. | 310/334 |
| 4,087,716 | 5/1978 | Heywang | 310/332 |
| 4,096,756 | 6/1978 | Alphonse | 310/334 X |
| 4,240,003 | 12/1980 | Larson, III | 310/326 |
| 4,398,116 | 8/1983 | Lewis | 310/334 |
| 4,460,841 | 7/1984 | Smith et al. | 310/334 |
| 4,477,783 | 10/1984 | Glenn | 333/138 |
| 4,518,889 | 5/1985 | Hoen | 310/357 |
| 4,714,846 | 12/1987 | Pesque et al. | 310/317 |
| 4,825,115 | 4/1989 | Kawabe et al. | 310/327 |
| 4,841,494 | 6/1989 | Banno | 310/337 X |
| 4,890,268 | 12/1989 | Smith et al. | 367/138 |
| 4,939,826 | 7/1990 | Shoup | 29/25.35 |
| 4,985,926 | 1/1991 | Foster | 381/77 |
| 5,015,929 | 5/1991 | Cathignol et al. | 310/335 |
| 5,099,459 | 3/1992 | Smith | 310/334 X |
| 5,259,099 | 11/1993 | Banno et al. | 310/359 X |

*Primary Examiner*—Mark O. Budd

[57] ABSTRACT

A two-dimensional ultrasonic transducer array includes a plurality of transducer elements, with each element having a plurality of piezoelectric layers. The transducer elements vary in transverse areas of radiating regions. The effect of the variations in transverse areas on the electrical impedances of the elements is at least partially offset by varying the specific impedance, i.e., impedance per unit area, of the transducer elements in the array. In a preferred embodiment, the specific impedance is varied by selecting the electrical arrangements of piezoelectric layers in each element according to the transverse area of the element. Series, parallel and series-parallel arrangements are employed. This impedance normalization improves the electrical connection of the transducer elements to driving circuitry. In alternative embodiments, impedance normalization is achieved by varying element thicknesses, element materials and/or degrees of poling across the two-dimensional array.

16 Claims, 13 Drawing Sheets

| | $S_1$ | $S_2$ | $S_3$ | $S_4$ | $S_5$ | $S_6$ |
|---|---|---|---|---|---|---|
| $F_0$ | 0 | $V_0$ | $V_0$ | 0 | 0 | $V_0$ |
| $1.5F_0$ | 0 | 0 | 0 | $V_0$ | $V_0$ | 0 |
| $3F_0$ | 0 | 0 | 0 | 0 | 0 | $V_0$ |

96

ELECTRICAL IMPEDANCE NORMALIZATION FOR AN ULTRASONIC TRANSDUCER ARRAY

TECHNICAL FIELD

The present invention relates generally to acoustic transducers and more particularly to two-dimensional ultrasonic transducer arrays.

BACKGROUND ART

A diagnostic ultrasonic imaging system for medical use forms images of tissues of a human body by electrically exciting a transducer element or an array of transducer elements to generate short ultrasonic pulses, which are caused to travel into the body. Echoes from the tissues are received by the transducer element or array of transducer elements and are converted into electrical signals. The electrical signals are amplified and used to form a cross sectional image of the tissues. Echographic examination is also used outside of the medical field.

While a number of advances have been made in echographic examining, further advances in optimizing acoustical properties of a transducer face the potential problem of sacrificing desired electrical properties. Initially, an imaging transducer consisted of a single transducer element. Acoustical properties were improved by providing a transducer formed by a one-dimensional array of transducer elements. Conventionally, one-dimensional transducer arrays have a rectangular or circular configuration, but this is not critical. Acoustical properties may be improved by providing a two-dimensional array in either a rectangular or annular configuration.

Focusing plays an important role in optimizing the acoustical properties of a transducer device. U.S. Pat. No. 4,477,783 to Glenn describes a mechanical lens used to focus acoustic energy to and from a single transducer element. Electronic focusing provides an alternative to the mechanical lens. Two-dimensional arrays can be phased by delaying signals to selected transducer elements so as to achieve a desired direction and focal range. Electronically focused transducer arrays offer the advantage that they can be held stationary during an echographic examination, potentially increasing resolution and the useful life of the device. The transducer elements are equal in size, so that a two-dimensional array can form a piecewise approximation of the desired curved delay profile. In order to reduce the total number of transducer elements, the number of transducer elements in the elevation dimension can be reduced. To obtain acceptable focusing properties, these elevation transducer elements are often different sizes to form a coarser piecewise linear approximation of the desired curved delay profile. The problem is that there are difficulties in employing the same driving circuitry to efficiently drive transducer elements of different sizes since the area of a radiating region of a transducer element is inversely proportional to the electrical impedance of that transducer element.

It is an object of the present invention to provide a transducer device having a plurality of transducer elements that can be efficiently driven using conventional driving circuitry without regard for comparative sizes of the transducer elements.

SUMMARY OF THE INVENTION

The above object has been met by a two-dimensional array of transducer elements with varying transverse areas, but with specific impedances that are adjusted inversely with transverse area. The specific impedances are selected to normalize electrical impedances across the array, so that driving circuitry can be efficiently coupled to each transducer element. Varying the transverse areas of the transducer elements in a two-dimensional array presents variations in the electrical load. "Impedance normalization" is defined as at least partially offsetting the effect of the differences in transverse areas. "Specific impedance" is defined as the impedance of a transducer element per unit area. Thus, unlike the electrical impedance to coupling to the driving circuitry, specific impedance is area-independent. The transducer device of the present invention utilizes a multilayer structure to maintain a generally constant ratio of electrical impedance to transverse area at each transducer element in the two-dimensional array.

In a preferred embodiment, varying the specific impedances of transducer elements is achieved by electrically connecting piezoelectric layers of each multilayer transducer element such that the piezoelectric layers are in series, parallel or series-parallel arrangements. A series arrangement of piezoelectric layers induces a higher electrical impedance than would be induced by a parallel arrangement. Since electrical impedance of an element is inversely proportional to the transverse area of the element, the impedance of a first element having an area less than that of a second element can be normalized by connecting the piezoelectric layers of the first element in parallel and the piezoelectric layers of the second element in series. Impedance normalization of a third transducer element having an area greater than the first element but less than the second element can be achieved by providing a series-parallel electrical circuit of piezoelectric layers at the third transducer element.

The two-dimensional array may have a large number of different sized transducer elements. Ideally, the differences in electrical circuits of piezoelectric layers completely offset the variations in size, so that the ratio of electrical impedance to transverse area is equal across the array. However, this ideal may not be achievable without increasing the number of piezoelectric layers beyond a practical limit. In such cases, the electrical circuits of piezoelectric layers should be connected to approach a norm, rather than to obtain an exact value of impedance at each element.

In a second embodiment, impedance normalization is achieved by varying the thickness of the transducer elements in proportionally corresponding manner to variations in transverse area. However, changes in thickness affect the resonant frequency. In a third embodiment, the selected piezoelectric material varies with the 10 transverse area of the elements. A piezoelectric layer having a higher dielectric constant will have a lower electrical impedance. Adjacent transducer elements may be made of different piezoelectric materials according to comparative transverse areas. Alternatively, different layers within a single transducer element may be comprised of different piezoelectric materials. A difficulty with this embodiment is that it adds complexity to the fabrication of the two-dimensional array. In a last embodiment, the degree of poling may be used to affect the specific impedance. A perfectly poled material will have a higher impedance at a resonant frequency. While degrees of poling may be used to control impedance, a relaxation of poling has the negative effect of reducing coupling efficiency, i.e. the efficiency of converting an electrical signal to mechanical waves and vice versa.

The two-dimensional array may be rectangular or annular or may have any other configuration. The use of different electrical connection of piezoelectric layers within a single transducer element may be used to control impedances of adjacent transducer elements for purposes other than normalizing impedances of elements having different transverse areas. However, the main advantage of the present invention is that impedance normalization can be achieved so as to allow electronic focusing of the array without compromising the coupling of driving circuitry to the array. That is, the present invention eliminates the tradeoff between optimizing acoustical properties of the array and optimizing electrical properties.

BEST MODE FOR CARRYING OUT THE INVENTION

Figure 1:
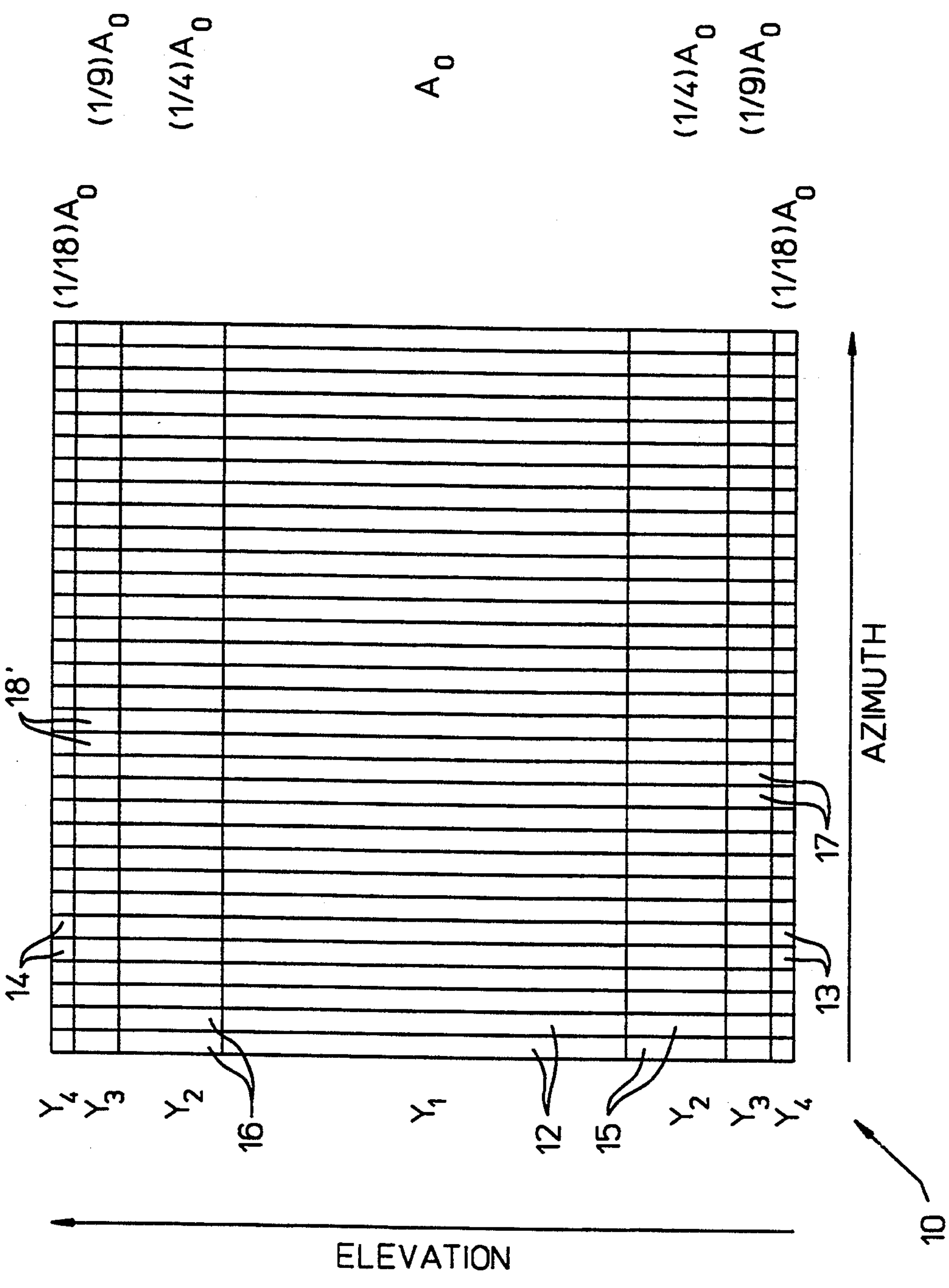
FIG. 1 illustrates one embodiment for achievement of impedance normalization for two-dimensional arrays based on impedance control in accordance with the present invention.

With reference to FIG. 1, a top view of a two-dimensional transducer array 10 is shown as including seven transducer elements in an elevational direction and thirty-two transducer elements in an azimuthal direction. The transducer elements 12 at elevation $Y_1$ have the greatest transverse area, with elements 13 and 14 having the smallest transverse area. The comparative areas of elements 12, 13 and 14, as well as those of elements 15, 10 16, 17 and 18, are indicated in FIG. 1.

Varying the transverse area of transducer elements 12–13 with elevation improves the acoustical properties of the two-dimensional array 10. In a manner known in the art, the array may be focused electronically. While electronic focusing improves echographic procedures, the changes in electrical impedance across the elements will vary proportionally with the changes in transverse areas, so that driving the elements becomes more problematic. As will be explained more fully below, the effect of changes in area is at least partially offset in the present invention, thereby allowing conventional drive circuitry to be used for each of the transducer elements. The present invention varies "specific impedance," i.e. impedance per unit area, to normalize the electrical impedances of the transducer elements in the array.

Figure 2A:
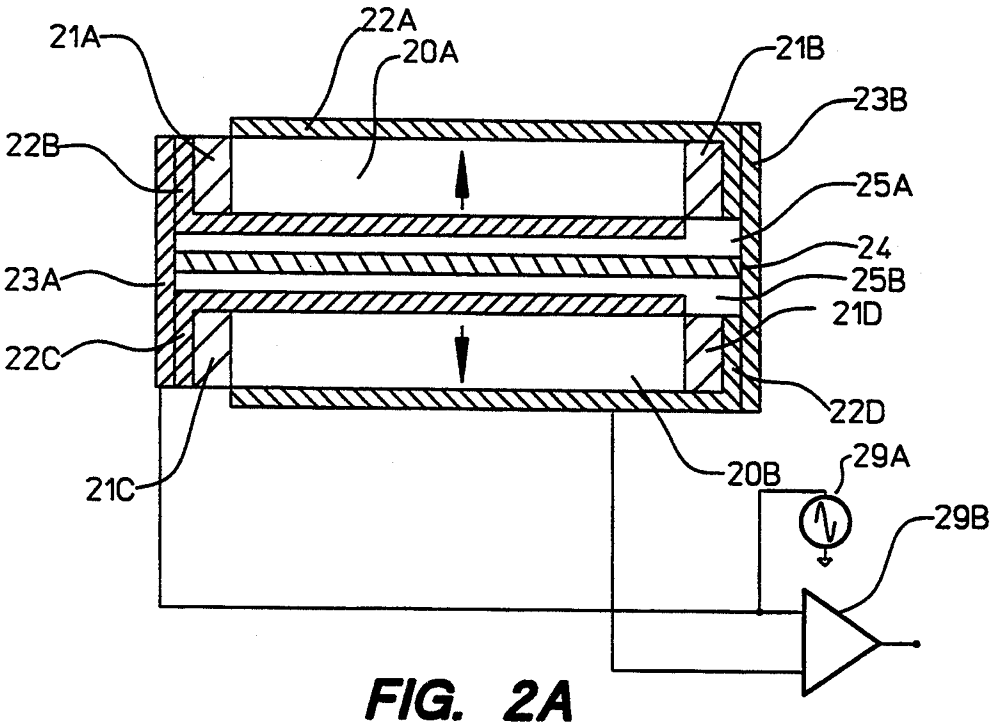
FIGS. 2A and 2B illustrate the difference between an even number of layers and an odd number of layers in a resonator stack.
Figure 2B:
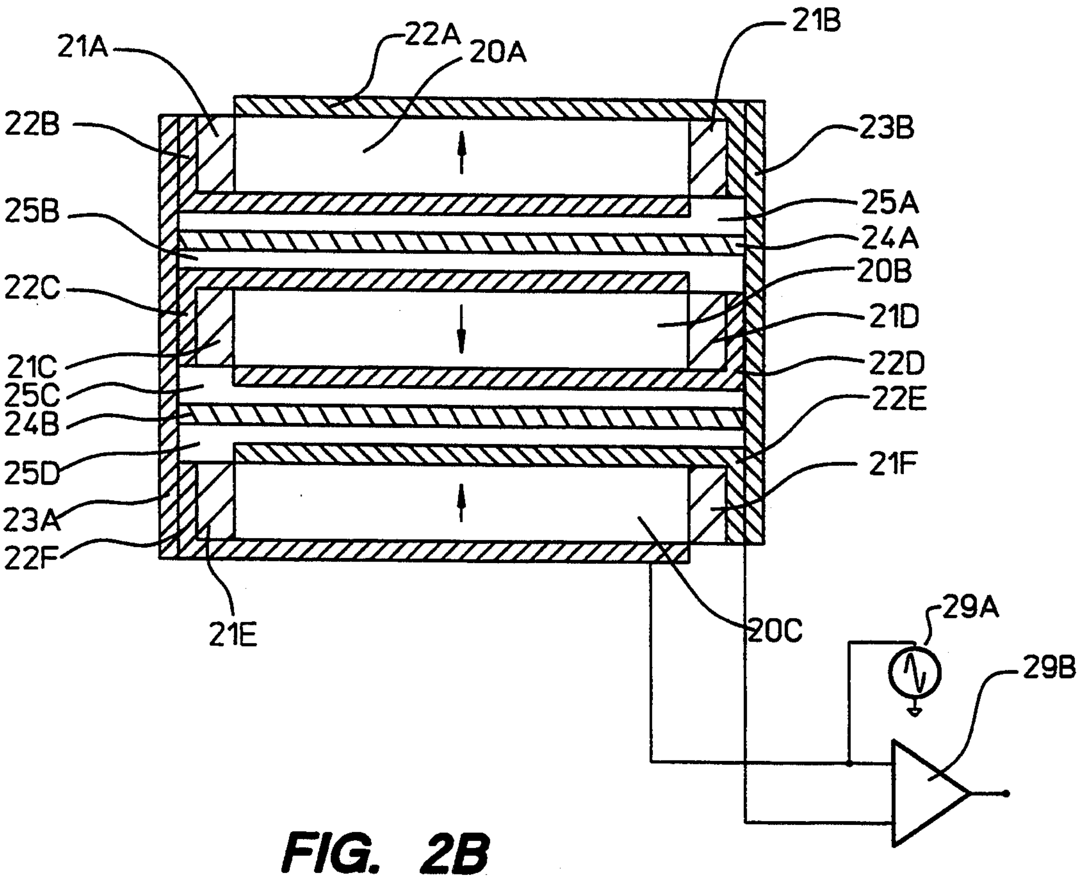

FIGS. 2A and 2B illustrate alternative embodiments of a single transducer element of FIG. 1. FIG. 2A is a resonator stack of two piezoelectric layers 20A and 0B. The piezoelectric layers have equal thicknesses and are wired in an electrically parallel arrangement. The two layers have opposite poling vectors, as indicated by the vertically directed arrows. "Piezoelectric" is defined as any material that generates mechanical waves in response to an electrical field applied across the material. Piezoelectric ceramics and polymers are known.

The transducer element of FIG. 2A includes a pair of external electrodes 22A and 22D that are connected by a side electrode 23B. Internal electrodes 22B and 22C are linked by a side electrode 23A.

Edge dielectric layers 21A, 21B, 21C and 21D physically separate electrodes 22A and 22D from electrodes 22B and 22C. Moreover, the edge dielectric layers minimize excitation of undesired lateral modes within the piezoelectric layers 20A and 20B. During the transmission of acoustic waves the lateral modes may arise from fringe electrical fields for previously poled piezoelectric material or from fringe fields for multilayer piezoelectric resonator stacks poled in situ. If electrodes were allowed to directly contact the opposed parallel sides of the piezoelectric layers, lateral modes could be excited within the piezoelectric layers. The type and properties of the material chosen for the edge dielectric layers determine the magnitudes of the fringe electric fields. In general, for the reduction of the magnitude of the lateral modes, use of dielectrics with dielectric constants much smaller than the dielectric constant of the piezoelectric layers will increase the effective separation of the side electrodes from the piezoelectric layers. The distance of separation between the electrode 22A and the side of electrode 22B, as provided by the edge dielectric layer 21A, preferably lies in the range of 10–250 mm. This separation must nominally stand off both the poling voltages and the operational applied voltages. Suitable dielectric materials for the edge dielectric layers, as well as internal dielectric layers 24A and 24B, include: oxides, such as $SiO_z (Z \geqq 1)$; ceramics, such as $Al_2O_3$ and PZT; refractory metals, such as $Si_xN_y$, BN and AlN; semiconductors, such as Si, Ge and GaAs; and polymers, such as epoxy and polyimide.

In a transmit mode, a voltage signal source 29A is utilized to provide an excitation signal to the piezoelectric layers 20A and 20B. In a receive mode, a differential amplifier 29B is employed, as well known in the art.

FIG. 2A illustrates a situation in which the number of piezoelectric layers 20A and 20B is even and the external electrodes 22A and 22D have the same polarity. In comparison, FIG. 2B illustrates an odd number of piezoelectric layers 20A, 20B and 20C, with external electrodes 22A and 22F having opposite polarity. Adjacent piezoelectric layers are attached using internal dielectric layers 24A and 24B, as well as bonding layers 25A, 25B, 25C and 25D. The thicknesses of the electrodes 22A–22D, the bonding layers 25A–25D and the internal dielectric layers 24A–24B are illustrated with exaggerated thicknesses for clarity. Typical thicknesses of the bonding layers and of the internal dielectric layers are less than 1 $\mu$m, and less than 100 $\mu$m, respectively.

Side electrodes 23A and 23B are optional, since the electrode layers 22A–22F can be electrically connected to one terminal of a group of one or more voltage sources 29A or differential amplifiers 29B. If the internal dielectric layers and the bonding layers are deleted, some of the intermediate electrode layers, such as 22B and 22C, can be optionally deleted.

Figure 3:
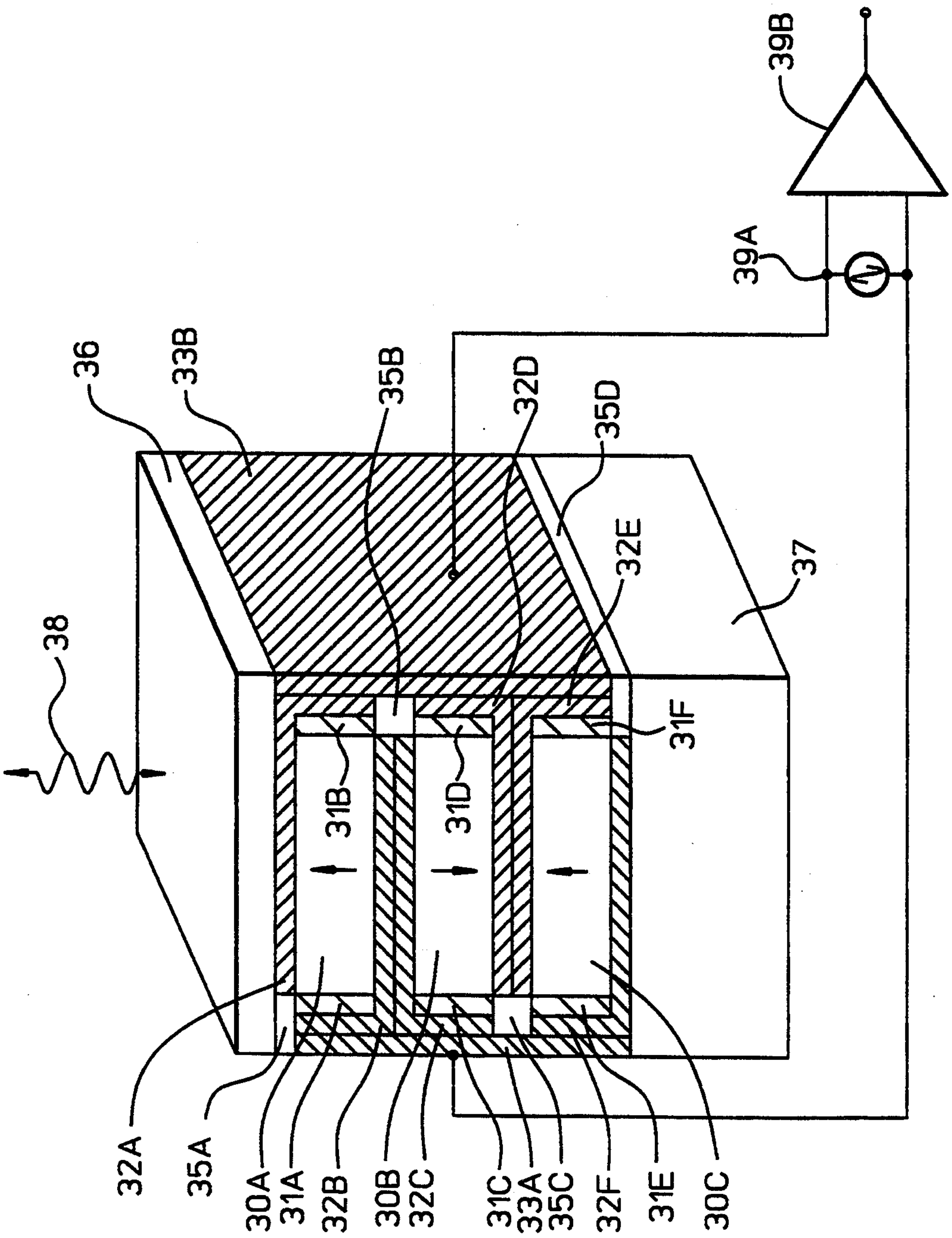
FIG. 3 illustrates the multilayer resonator stack assembled into a transducer.

FIG. 3 illustrates an acoustic transducer element wired for fixed electrically parallel excitation, with alternating poling directions for three piezoelectric layers 30A, 30B and 30C. The transducer element includes the three piezoelectric layers, three pairs of edge dielectric layers 31A/31B, 31C/31D and 31E/31F, three pairs of individually controlled electrodes 32A/32B, 32C/32D and 32E/32F that surround the respective piezoelectric layers, and side electrodes 33A and 33B. The internal dielectric layers that separate the electrodes are not shown in FIG. 3. An optional backing layer may be included. The backing layer is made of a material which absorbs ultrasonic waves in order to eliminate reflections from the back side of the piezoelectric layer 30C. A front matching layer 36, for matching the acoustic impedance of the transducer element to the material to which acoustic waves 38 are to be transmitted may also be used. A suitable material for the backing layer may be a heavy metal, such as tungsten, in a lighter matrix such as a polymer or a ceramic. A suitable material for the front matching layer includes graphite, epoxy, polyimide or other similar compounds with an acoustic impedance between that of the piezoelectric material and the ambient medium.

Figure 4:
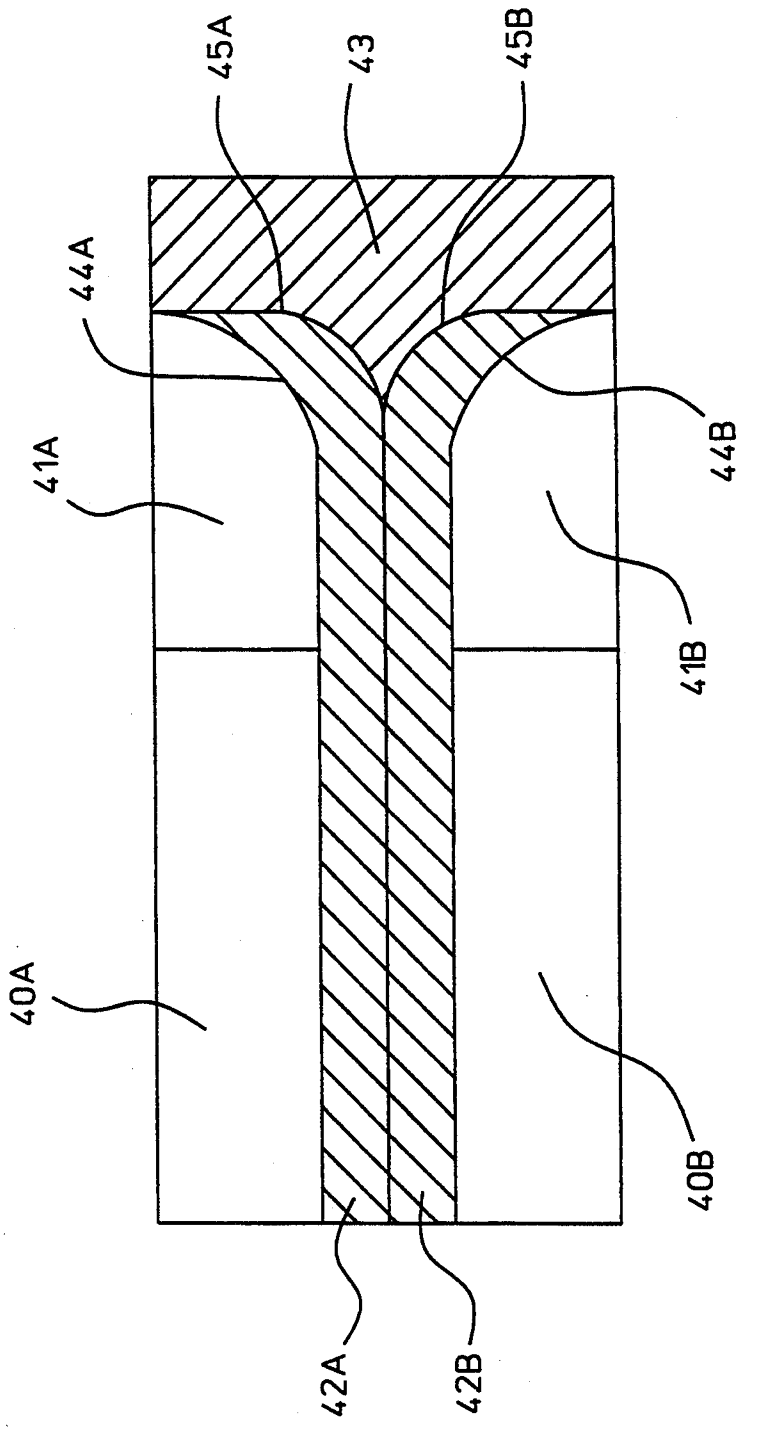
FIG. 4 illustrates use of a curvilinear interface of an edge dielectric layer and adjacent electrodes.

FIG. 4 illustrates a refinement of the electrical connection between first and second conductive electrodes 42A or 42B and an external or side electrode 43. The reliability of the electrical contact can be improved by providing rounded or arcuate surfaces 44A and 44B on the adjacent edge dielectric 41A and 41B and rounded or arcuate surfaces 45A and 45B at the interface of the two conductive electrodes 42A and 42B with the external electrode 43. The external electrode 43 is deposited over the piezoelectric layers 44A and 44B and the edge dielectrics 41A and 41B are bonded together, thereby allowing the external electrode to conform to the geometry of the rounded corners as shown.

Figure 5A:
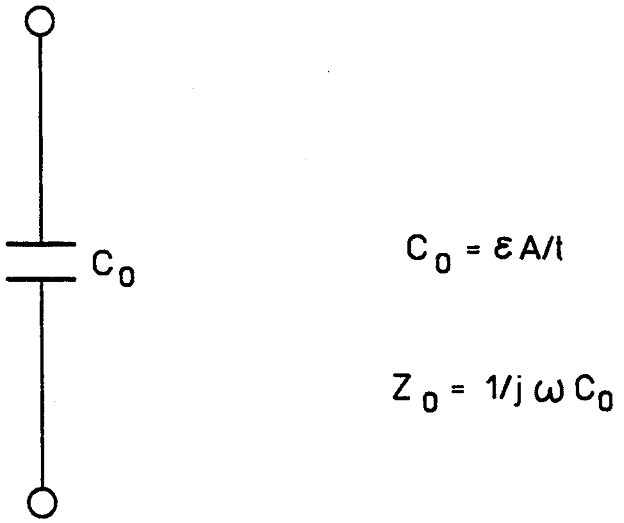
FIGS. 5A and 5B illustrate achievement of reduced impedance for multilayer transducers.
Figure 5B:
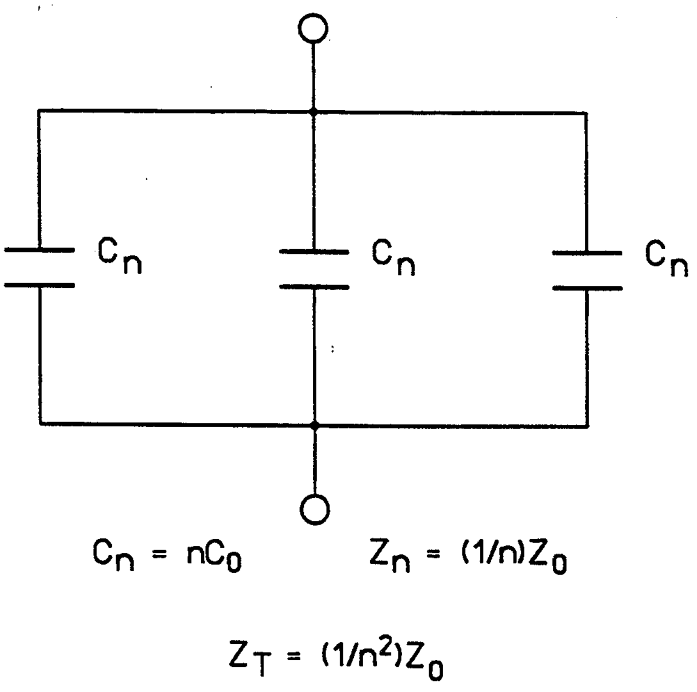

A multilayer piezoelectric resonator stack has several useful features, if the individual piezoelectric layers are of uniform thickness and the adjacent piezoelectric layers have opposite poling directions. In this configuration, the piezoelectric layers act mechanically in series, but act electrically in parallel. FIG. 5 illustrates how impedance reduction can be achieved for a multilayer transducer element if the piezoelectric layers are electrically connected in parallel. For a piezoelectric layer of capacitance $C_0=\epsilon A/t$, where $\epsilon$ is the dielectric constant of the piezoelectric layer, A is the transverse area of the piezoelectric layer and t is the thickness of the piezoelectric layer, the electrical impedance is given by $Z_0=1/(j\omega C_0)$, where $\omega=2\pi f$ is the angular frequency of interest. For N piezoelectric layers, each having capacitance $C_0$, the total electrical impedance is $Z_T=Z_o/N^2$. Thus, use of an N-layer transducer element with parallel electrical connections can reduce the electrical impedance by a factor of $N^2$. If a single piezoelectric layer of thickness T (the "comparison layer") requires an applied voltage of $V_0$, a multilayer resonator stack of N piezoelectric layer, also of thickness T, constructed as illustrated in FIGS. 2A and 2B with parallel electrical connections, requires an applied voltage of only $V_0/N$ to achieve an equivalent piezoelectric stress field. This occurs because of the reduced piezoelectric layer thickness between adjacent electrodes. If the required applied transmit voltage for the comparison layer is 50–200 volts, the required applied voltage for a multilayer resonator stack can be reduced to the range of 5–15 volts, which is suitable for integration with high density integrated circuits.

The electrical bandwidth of an N-layer resonator stack can also be increased relative to the bandwidth of the comparison layer. Each piezoelectric layer in the multilayer resonator stack is a lambda/2 resonator operating at N times the fundamental frequency $F_0$ for the comparison single resonator, neglecting the effect of strong coupling between piezoelectric layers. With an appropriate choice of series and parallel electrical connections to the individual electrodes between the piezoelectric layers, a multilayer resonator stack can also operate as a multifrequency acoustic transducer with a plurality of discrete fundamental frequencies.

Figure 6A:
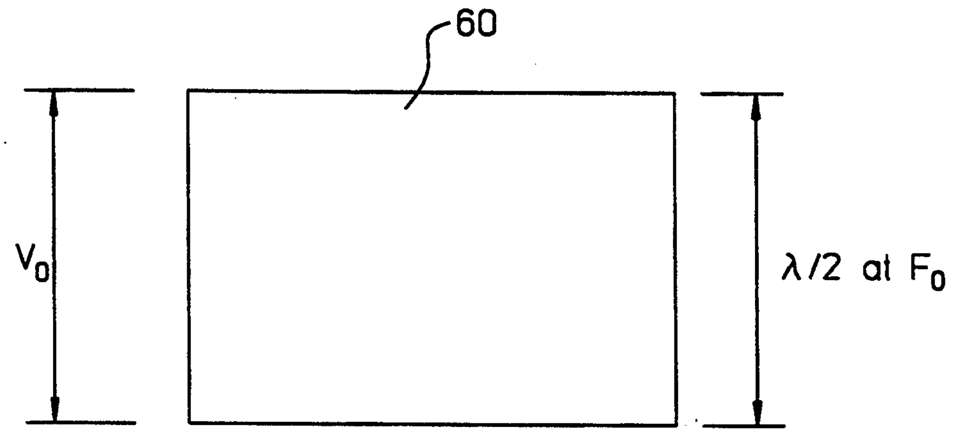
FIGS. 6A and 6B illustrate achievement of voltage reduction and multifrequency operation for multilayer transducers.
Figure 6B:
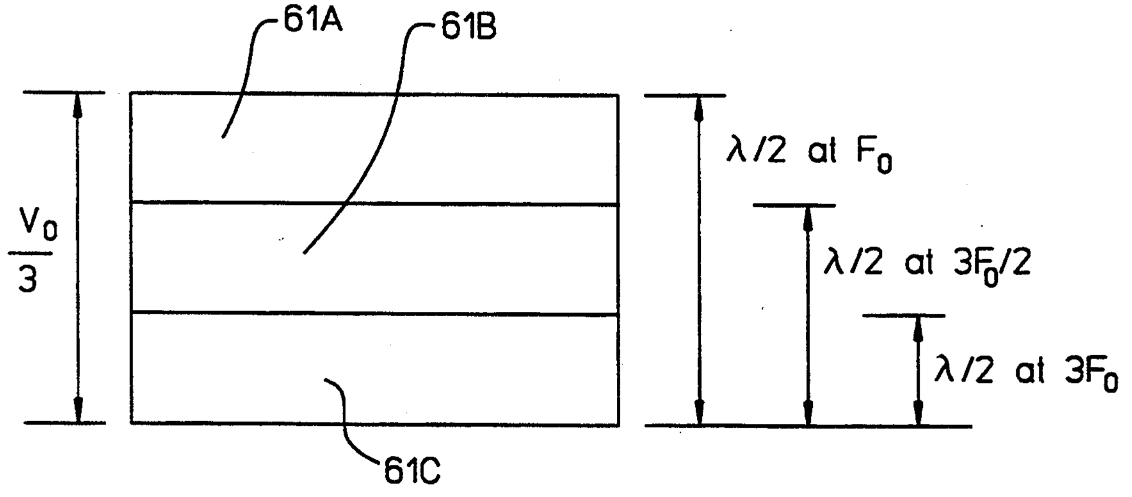

FIGS. 6A and 6B illustrate how voltage reduction can be achieved for a multilayer transducer element where the piezoelectric layers are electrically connected in parallel, and how multifrequency operation can be achieved if the electrical connections of individual piezoelectric layers are programmable. For a single piezoelectric layer 60, an applied voltage of $V_0$ gives a resonance frequency of $F_0$, for a thickness of lambda/2. For a transducer element having three piezoelectric layers 61A, 61B and 61C of total thickness lambda/2 and connected in parallel, the required applied voltage to achieve the independent total electric field in the three-layer resonator stack is $V_0/3$. For independent electrical connections to the piezoelectric layers, the possible resonance frequencies are $F_0$, $3F_0/2$ and $3F_0$, using two, three or one piezoelectric sublayers in combination, respectively.

Figure 7A:
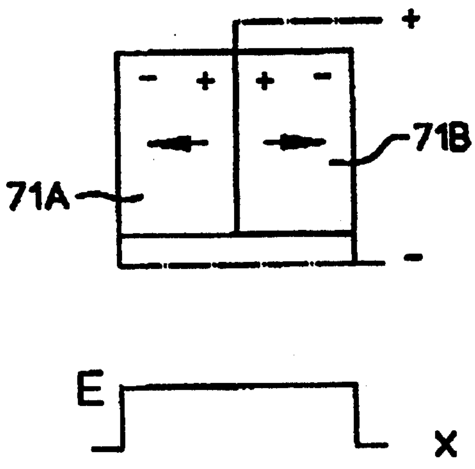
FIGS. 7A, 7B, 7C and 7D illustrate the effect of poling direction on two-layer and three-layer structures.
Figure 7B:
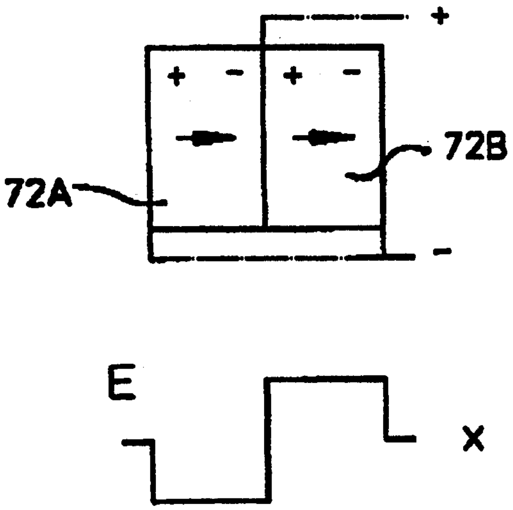
Figure 7C:
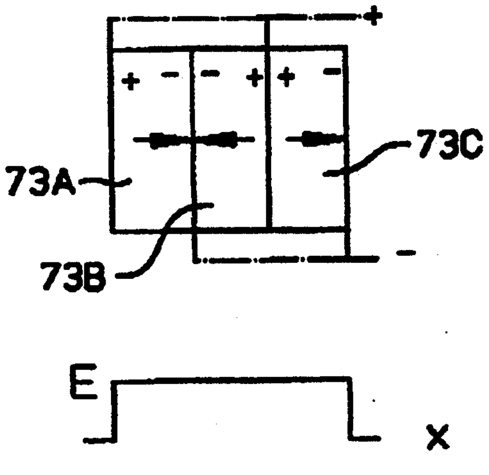
Figure 7D:
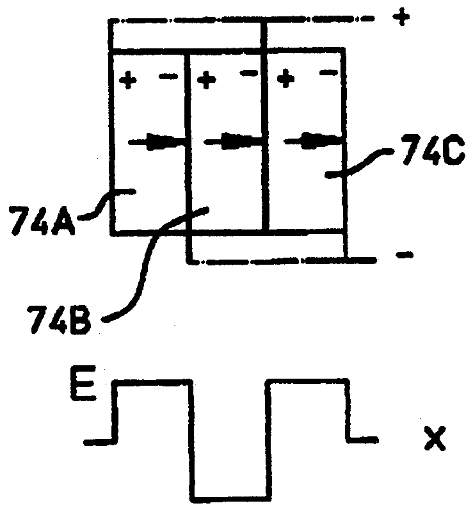

FIGS. 7A, 7B, 7C and 7D illustrate the effect on the spatial distribution of the electric field E and the fundamental resonant frequency of the piezoelectric resonator stack for parallel electrical connections for both parallel and opposite poling directions in adjacent piezoelectric layers. Positioned below each transducer configuration is a plot of the electric field as a function of distance x, measured from front to back (or inversely, through a multilayer piezoelectric stack). FIG. 7A has two piezoelectric layers 71A and 71B with opposite poling directions. FIG. 7B illustrates two piezoelectric layers 72A and 72B having parallel poling directions. The configurations of FIGS. 7A and 7B produce resonant frequencies of $F_0$ and $2F_0$, respectively. FIG. 7C illustrates three piezoelectric layers 73A, 73B and 73C having opposite poling directions for adjacent piezoelectric layers. FIG. 7D illustrates three piezoelectric layers 74A, 74B and 74C having parallel poling directions. FIGS. 7C and 7D produce resonant frequencies of $F_0$ and $3F_0$, respectively.

Figure 8:
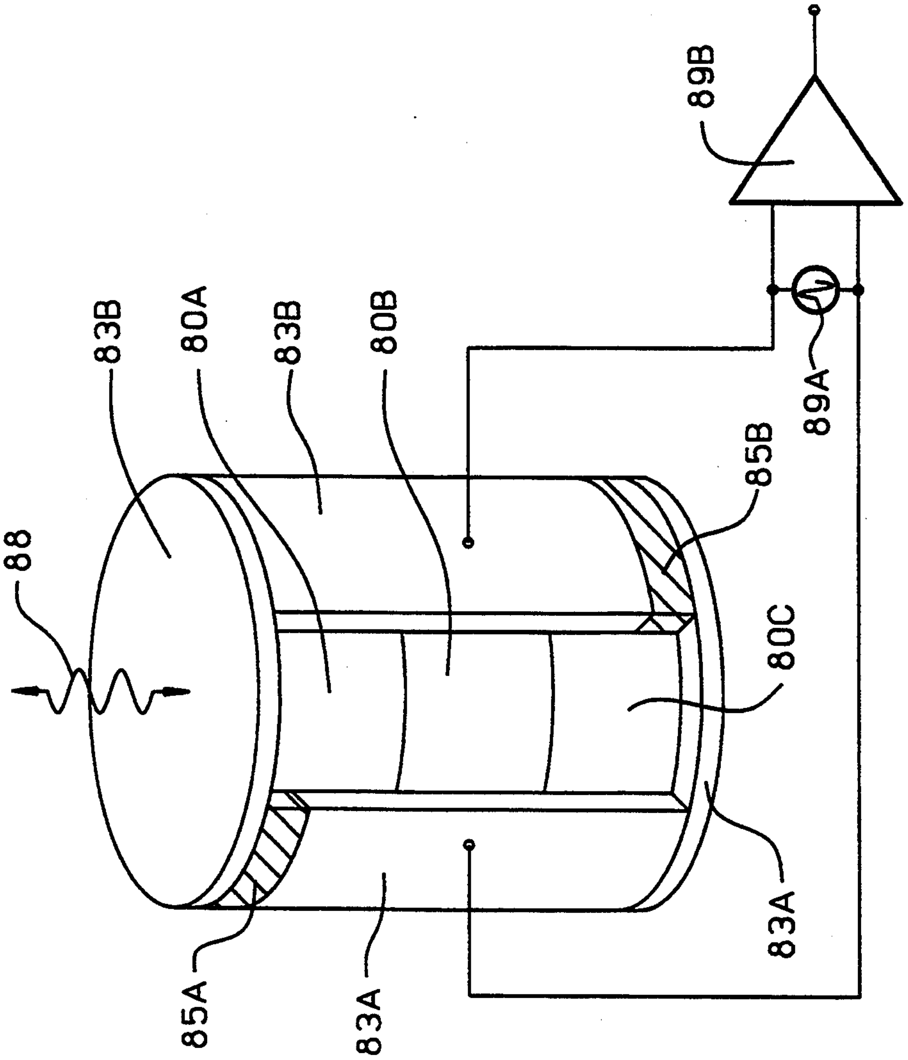
FIG. 8 illustrates a cylindrical multilayer transducer structure.

FIG. 8 illustrates an embodiment in which a transducer element is a right circular cylinder having three piezoelectric layers 80A, 80B and 80C. An acoustic wave 88 is shown for both the transmit and receive modes of operation. The three piezoelectric layers are shown without internal conductive electrodes and bonding layers for clarity. Two external electrodes 83A and 83B of opposite polarity are connected to the bottom and top of the transducer element and partially wrap around the sides of the piezoelectric layers. Insulating dielectric layers 85A and 85B isolate the two external electrodes. A voltage source 89A for the transmit mode and a differential amplifier 89B for the receive mode are also incorporated.

Figures 9A, 9B:
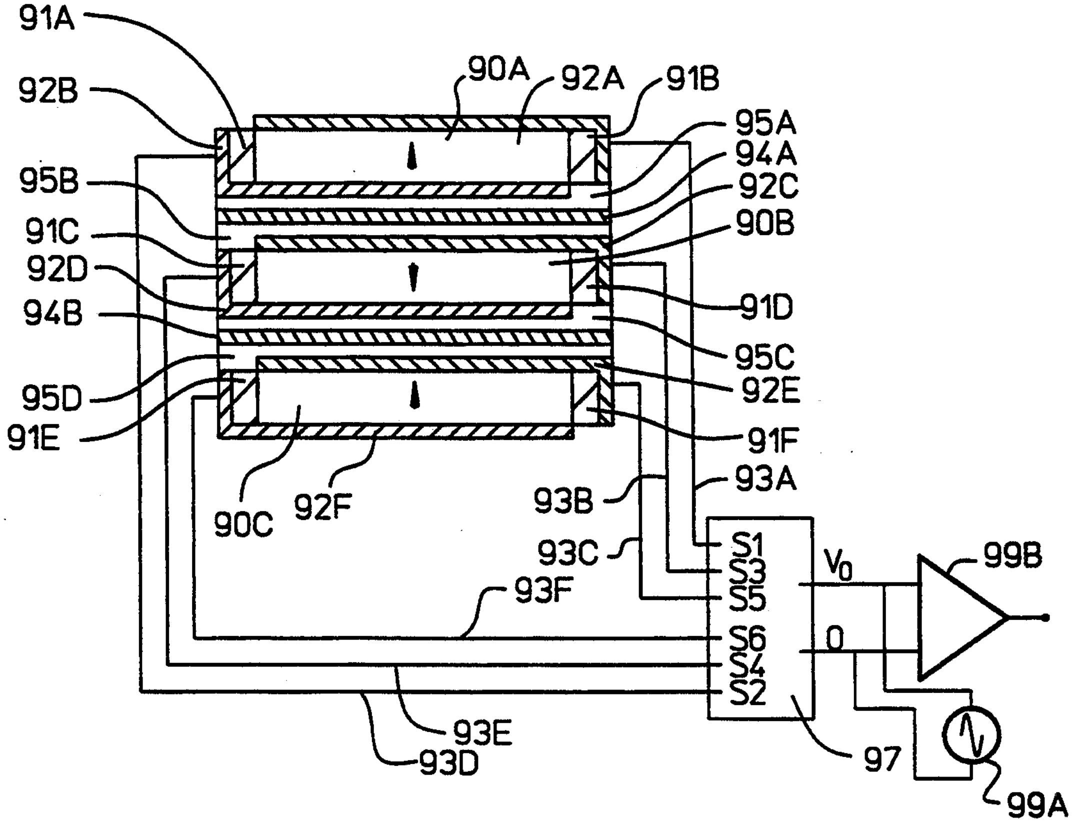
FIGS. 9A and 9B illustrate multifrequency operation of a transducer using isolated internal electrode layer and a multiplexer circuit.

Multifrequency operation may be achieved if the electrodes are individually addressable. This requires use of thin electrical isolation layers that minimally perturb an acoustic wave that passes therethrough. FIGS. 9A and 9B define an embodiment having three piezoelectric layers 90A, 90B and 90C that are individually addressable for multifrequency operation. The piezoelectric layers 90A, 90B and 90C have respective conductive electrode pairs 92A/92B, 92C/92D and 92E/92F, respective edge dielectric pairs 91A/91B, 91C/91D and 91E/91F, and bonding layers 95A, 95B, 95C and 95D. The internal electrodes 92B, 92C, 92D and 92E are isolated by internal dielectric layers 94A and 94B. Each of the electrodes is connected to an individual signal line 93A, 93B, 93C, 93D, 93E and 93F, respectively, all of which are connected to a multiplexer circuit 97. A voltage source 99A for the transmit mode and a differential amplifier 99B for the receive mode are also provided. The table shown in FIG. 9B exhibits the various voltage assignments required for the signal lines 93A-93F to produce resonant frequencies of $F_0$, $3F_0/2$, and $3F_0$. For example, an assignment of voltage $V_0$ to signal lines 93B, 93C and 93F will produce a resonant frequency $F_0$.

A multifrequency transducer element may also be constructed by use of nonuniform thicknesses for the piezoelectric layers. These nonuniform piezoelectric layers may be assembled from uniform thickness layers that are permanently connected together to form nonuniform thickness layers. FIGS. 10A–10F illustrate multifrequency operation from the largest nonredundant integer resonator stack, i.e. the largest resonator stack whose members have integer ratios of thickness and for which there are no redundant frequencies. This resonator stack can produce resonant frequencies of $F_0$, $1.2F_0$, $1.5F_0$, $2F_0$, $3F_0$ and $6F_0$.

Figures 10A, 10B, 10C, 10D, 10E, 10F:
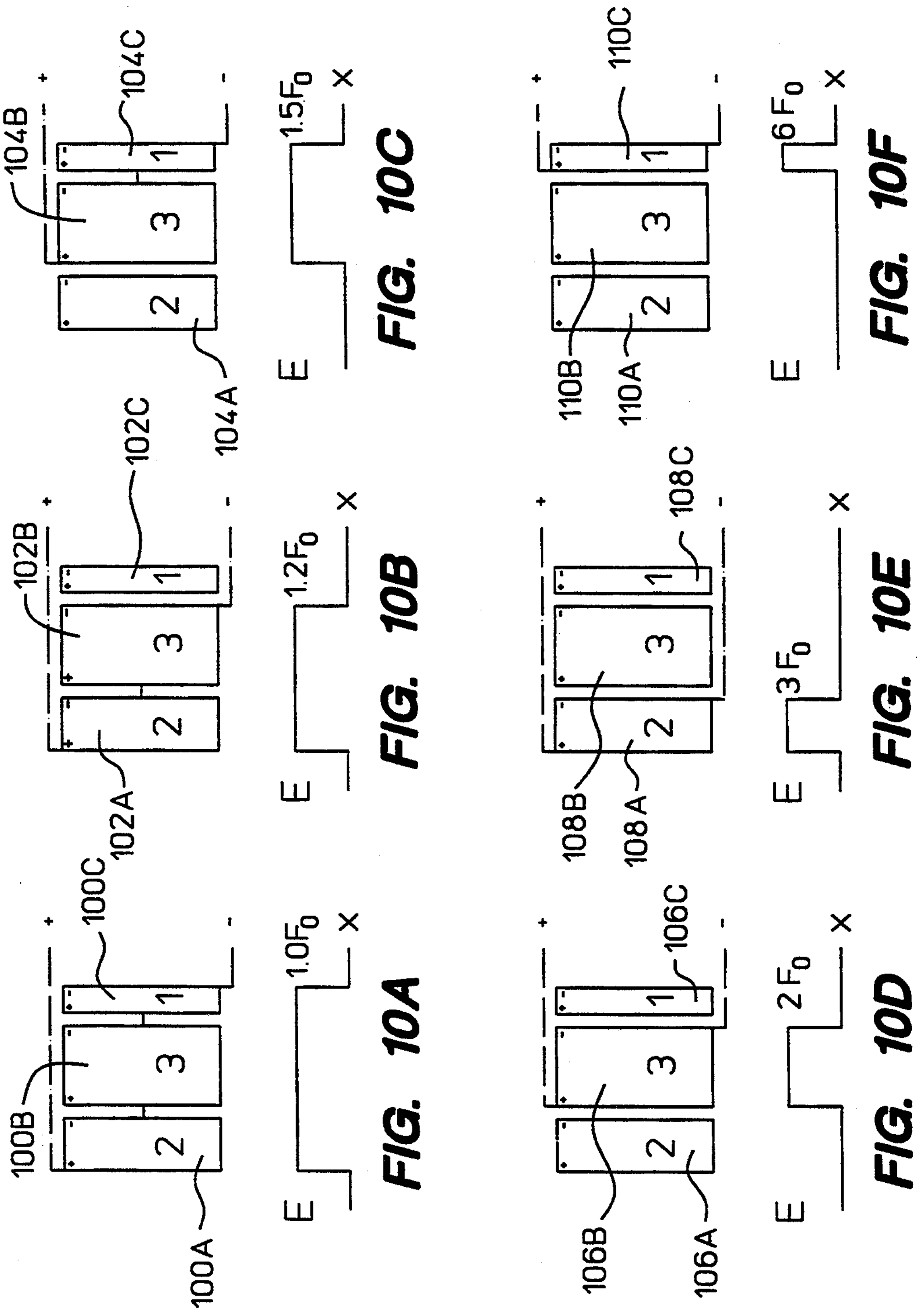
FIGS. 10A–10F illustrate multifrequency operation using the largest nonredundant integer resonator stack.

FIG. 10A produces a resonant frequency $F_0$ with piezoelectric layers 100A, 100B and 100C connected in series. FIG. 10B produces a resonant frequency $1.2F_0$ using piezoelectric layers 102A and 102B connected in series, while layer 102C is left inactive. FIG. 10C produces a resonant frequency $1.5F_0$ by connecting piezoelectric layers 104B and 104C in series. FIG. 10D produces a resonant frequency $2F_0$ using only the largest piezoelectric layer 106B, leaving layers 106A and 106B inactivated. FIG. 10E produces a resonant frequency $3F_0$ using only piezoelectric layer 108A. FIG. 10F produces a resonant frequency $6F_0$ using only the thinnest piezoelectric layer 110C. All resonator stacks having four or more piezoelectric layers with integer ratios of thicknesses generate a sequence of frequencies that include redundant frequencies. The ratio of individual layer thicknesses for a multilayer, multifrequency transducer element is not restricted to integral multiples of a single thickness.

ELECTRICAL IMPEDANCE NORMALIZATION BY VARYING SPECIFIC IMPEDANCE

As noted above with reference to FIG. 1, two-dimensional transducer arrays 10 may be used in echographic examinations. Excitation signals which energize the individual transducer elements 12–18 may be shifted in phase to radiate ultrasonic energy at a focal point. Controlling the phase of the excitation signals applied to the elements allows variations in the focus or steering angle. Improved focusing is available by changing the transverse areas of the elements as shown in FIG. 1. Ideally, a two-dimensional array has an infinite number of equal sized transducer elements that allow the array to act as a piecewise step approximation of a cylindrical lens. However, practical considerations significantly limit the number of transducer elements. Thus, the array of FIG. 1 utilizes transducer elements of different sizes to achieve improved acoustical characteristics.

One difficulty with this approach is that a change in the transverse area of a transducer element 12–18 affects the electrical load presented to driving circuitry by the transducer element. The electrical impedance of an element is inversely proportional to the transverse area of the element. Consequently, the electrical impedance of each transducer element 12 is 1/9, i.e. 11%, the electrical impedance of each transducer element 17. Using the same driving circuitry for each of the transducer elements 12–18 would create significant impedance mismatches for at least some of the connections. The driving circuitry can be modified according to the number of different element areas, but the modification would add to the complexity and the expense of manufacturing an ultrasonic device.

Figure 11A:
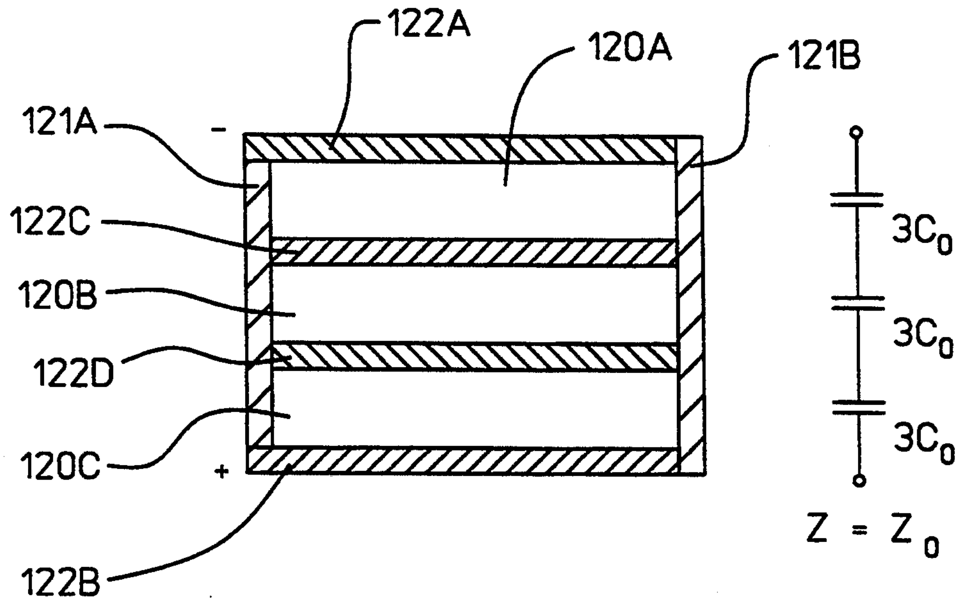
FIGS. 11A–11D illustrate achievement of impedance control based on series/parallel interconnection combinations.
Figure 11B:
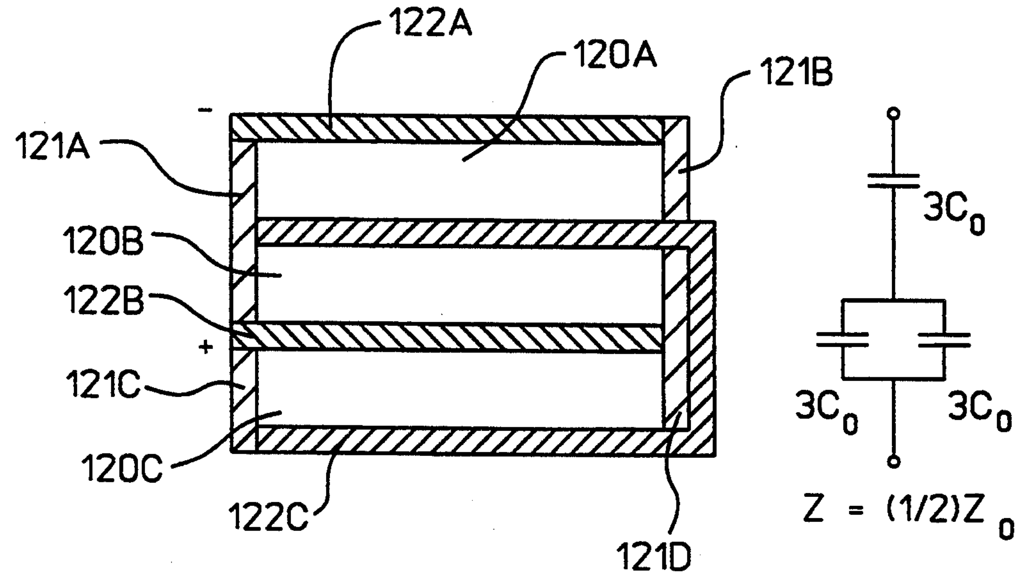
Figure 11C:
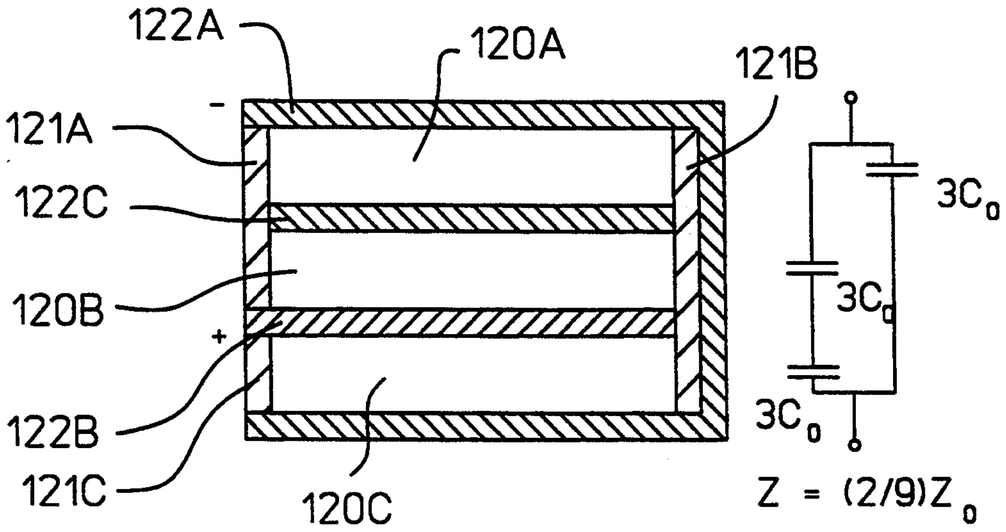
Figure 11D:
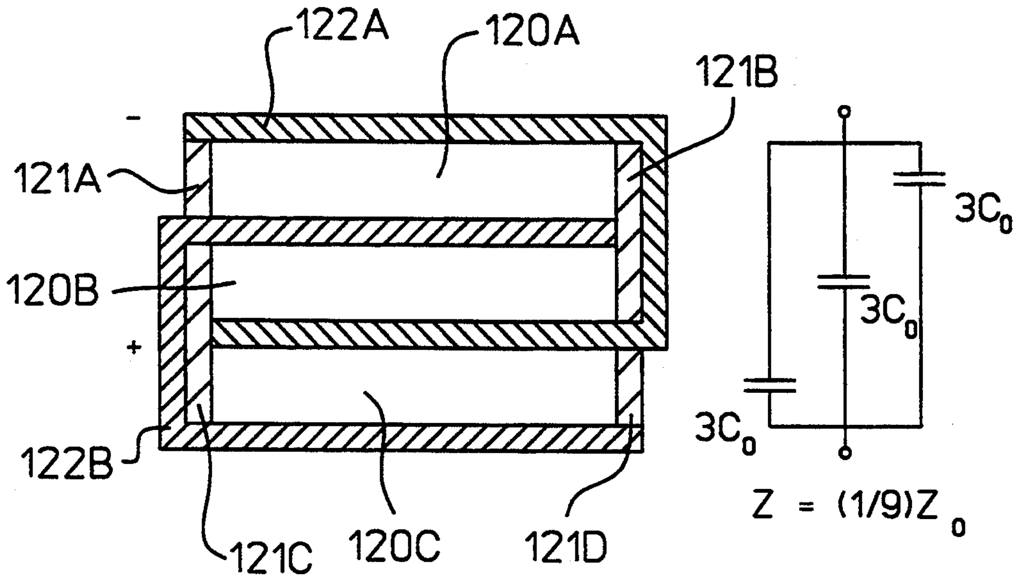

The present invention provides an impedance normalization for two-dimensional transducer arrays 10. In a first embodiment, each piezoelectric layer of a particular multilayer transducer element 12–18 is connected to the remaining piezoelectric layers of that element in a manner to at least partially offset the effect of changes in transverse area. For example, if the elements each have three piezoelectric layers, the difference in transverse area between element 12 and element 17 can be completely offset by utilizing the layer connections of FIGS. 11A and 11B. The series arrangement of FIG. 11A will induce an electrical impedance that is nine times greater than the parallel arrangement of FIG. 11D, all other factors being equal. Because the different wiring arrangements can be used to adjust the specific impedances of the transducer elements, substantially the same electrical load can be presented to driving circuitry by each transducer element despite the differences in transverse areas.

The difference in transverse areas between elements 12 and elements 15 can be partially offset by utilizing the series-parallel wiring arrangement of 11C in connecting the three layers of transducer elements 15. The difference in areas would otherwise induce an electrical impedance at elements 15 that would be four times the impedance of elements 12, but the series-parallel arrangement adjusts the specific impedance so as to provide an electrical impedance that is approximately 22% of that established by a purely series electrical arrangement. An impedance equalization would be preferred, but is not critical. An arrangement closer to the ideal is possible by increasing the number of layers, but this would also increase the cost of fabrication.

Another embodiment of the present invention is to offset the differences in transverse areas by using different dielectric materials in forming the transducer elements. Electrical impedance is inversely proportional to the dielectric constant of the piezoelectric material. Consequently, transducer element 15 may be made of a piezoelectric material having a higher dielectric constant than the material in forming elements 12, thereby at least partially offsetting the effect of the difference in areas.

The embodiment of electrically arranging the piezoelectric layers of an element 12–18 is preferred to the embodiment of varying the piezoelectric materials, since different materials will have characteristics, e.g., coefficients of thermal expansion, that affect operation. Moreover, the choice of piezoelectric materials is limited. In any case, utilizing different piezoelectric materials adds to the complexity of fabrication. The additional complexity is particularly acute if greater impedance control is acquired by varying the piezoelectric material from layer to layer in a single transducer element 12–18.

A third embodiment is to vary the thickness of the transducer elements 12–18 with changes in transverse area. Thickness is directly proportional to electrical impedance. However, in most applications, this embodiment is not practical, since changing the thickness of a transducer element will change the resonant frequency as well.

In yet another embodiment, the degrees of poling may be manipulated to provide impedance normalization. The impedance of poled material is higher at the resonant frequency. By providing degrees of poling, the electrical impedance can be varied as desired. Again, electrically rewiring the transducer elements 12–18 is preferred, since varying degrees of poling will vary electrode-to-piezoelectric layer coupling. Poling strengthens the coupling for electrical-to-mechanical conversion, and vice versa. Consequently, in this embodiment a reduction in impedance is possible only by a loss of efficiency.

Figure 12:
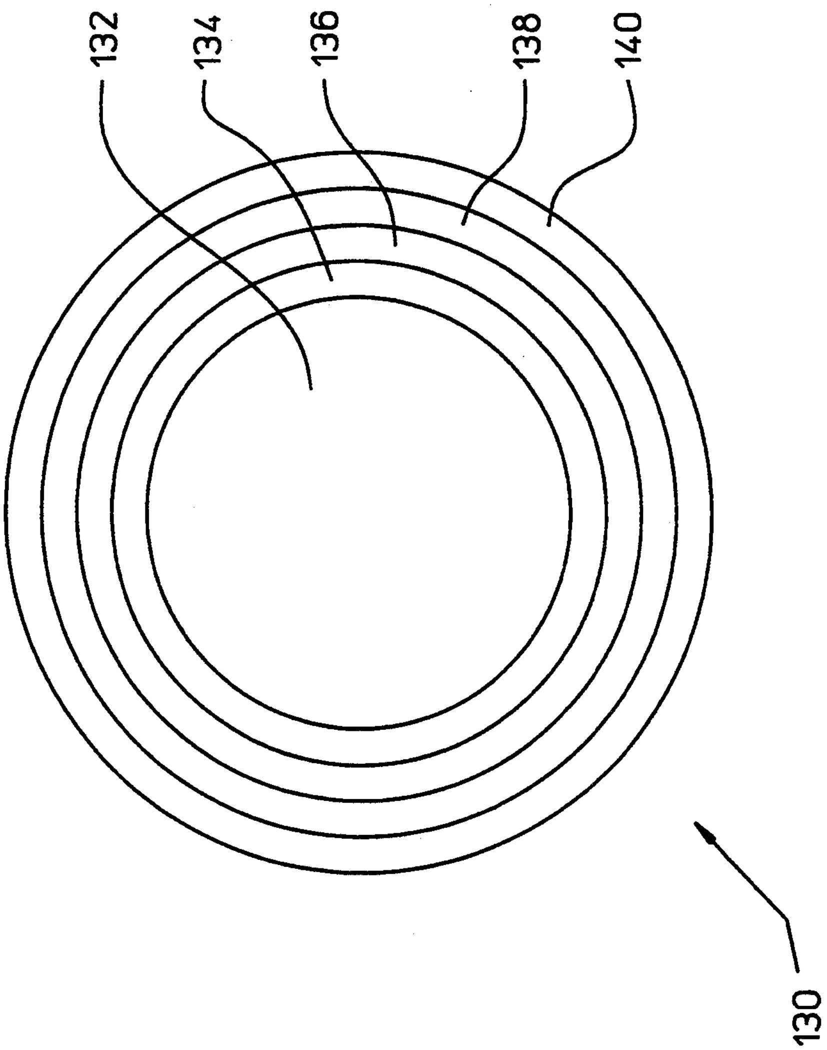
FIG. 12 is a top view of an annular array of transducer elements for achievement of impedance normalization based on impedance control in accordance with the present invention.

Referring now to FIG. 12, the present invention may also be used with an annular array 130 in which the radiating regions of the transducer elements 132, 134, 136, 138 and 140 have concentric ring shapes. Conventionally, each ring has been given an equal area, so that the rings become thinner with the distance of a ring from the center. This arrangement does not maximize the focusing ability of the array. Employing the present invention with the annular two-dimensional array allows a designer to select transverse areas based upon operational considerations other than electrical impedance.

In FIG. 12, the outer radii of the transducer elements 132–140 may be 4.5 mm, 5.3 mm, 6.0 mm, 6.7 mm and 7.5 mm, respectively. In the absence of impedance normalization, the electrical impedances of transducer elements 136 and 138 would be more than six times the electrical impedance of the largest transducer element 132. However, by fabricating each transducer element in the array to include a number of piezoelectric layers, and by adjusting the specific impedances of the different transducer elements in one of the manners described above, the electrical impedances can be normalized to improve the electrical performance of the array. For example, the layers of transducer element 132 may be connected in electrical parallel, while the layers of transducer elements 136 and 138 may be connected in electrical series. The layers of the remaining transducer elements 134 and 140 would then be connected in a series-parallel arrangement to achieve an intermediate specific impedance for electrical-impedance normalization.

The changes in electrical impedance as provided by the series, parallel and series-parallel arrangements of FIGS. 11A–11D for different transducer elements in a two-dimensional array can also be utilized for arrays in which each element has a uniform size. Preferably, the various layers are individually addressable by a switching mechanism such as the multiplexer 97 shown in FIG. 9A.

We claim:

1. A transducer device comprising,
   excitation means for supplying a signal to generate waves in piezoelectric material,
   an array of piezoelectric transducer elements electrically coupled to said excitation means, each transducer element having an impedance per unit area, said array including first and second transducer elements having radiating regions having different transverse areas, said first and second transducer elements thereby having different impedances, and
   means to adjust impedance per unit area for at least partially offsetting said difference between said impedances of said first and second transducer elements, said means to adjust including a connection of said first transducer element to drive circuitry in a manner electrically different from a connection of said second transducer element to drive circuitry.

2. The device of claim 1 wherein each transducer element has a plurality of piezoelectric layers and said means to adjust includes said first transducer element having piezoelectric layers that are electrically connected in parallel and said second transducer element having piezoelectric layers that are electrically connected in series.

3. The device of claim 1 wherein said first and second transducer elements are elements in a two-dimensional array of ultrasonic transducers.

4. The device of claim 1 wherein each of said first and second transducer elements includes a plurality of piezoelectric layers and electrode layers disposed therebetween.

5. The device of claim 4 wherein said means to adjust includes switching means for varying interconnection of selected ones of said electrode layers, thereby controlling the electrical impedances of said first and second transducer elements.

6. The device of claim 1 wherein each transducer element has a plurality of piezoelectric layers, said transverse area of said first transducer element being less than said transverse area of said second transducer element, said means to adjust includes piezoelectric layers of said first transducer element having a higher dielectric constant than piezoelectric layers of said second transducer element.

7. The device of claim 1 wherein said means to adjust includes having said first and second transducer elements that are different with respect to at least one of thickness and degree of poling, thereby achieving said differing impedances per unit area.

8. The device of claim 1 wherein said first and second radiating regions are annular regions that are concentric.

9. A transducer device comprising, an array of transducer elements, said transducer elements each having a stack of piezoelectric layers, and electrode means for impressing an excitation signal across said piezoelectric layers, said electrode means being connected to establish different electrically parallel and series arrangements of said piezoelectric layers for different transducer elements of said array, with the different electrically parallel and series arrangements being selected to control electrical impedances across said different transducer elements, wherein said transducer elements include first elements and second elements, each first element having a radiating region having a first transverse area and each second element having a radiating region having a second transverse area greater than said first transverse area.

10. The transducer of claim 9 wherein said array of transducer elements is a two-dimensional array of ultrasonic transducers.

11. The transducer of claim 9 further comprising means for supplying said excitation means to said electrode means.

12. The transducer of claim 9 wherein said electrode means includes electrode layers between adjacent piezoelectric layers of each transducer element.

13. A two-dimensional ultrasonic transducer array comprising, a plurality of first transducer elements, each first transducer element having a plurality of piezoelectric layers and a plurality of electrode layers at opposed faces of said piezoelectric layers to impress an excitation signal across said piezoelectric layers, each first transducer element having a radiating surface having a first transverse area, a plurality of second transducer elements, each second transducer element having a plurality of piezoelectric layers and a plurality of electrode layers at opposed faces of said piezoelectric layers to impress said excitation signal across said piezoelectric layers, each second transducer element having a radiating surface having a second transverse area that is greater than said first transverse area, means for electrically connecting said electrode layers of said first transducer elements to establish a first electrical circuit of piezoelectric layers, said first transducer elements having a first impedance per unit area and a first electrical impedance, and means for electrically connecting said electrode layers of said second transducer elements to establish a second electrical circuit of piezoelectric layers, said second electrical circuit inducing a second impedance per unit area greater than said first impedance per unit area, whereby said second electrical circuit causes the electrical impedance of said second transducer elements to approach said first electrical impedance.

14. The transducer array of claim 13 wherein the ratio of said first impedance per unit area to said second impedance per unit area approaches the ratio of said second transverse area to said first transverse area.

15. The transducer array of claim 13 further comprising a plurality of third transducer elements, each having a third transverse area and each having a plurality of piezoelectric layers that are interconnected to provide an electrical impedance approaching said first electrical impedance.

16. The transducer array of claim 13 wherein said means for electrically connecting said electrode layers includes a switch for selectively establishing series and parallel arrangements of piezoelectric layers for each of said first and second transducer elements.

* * * * *